United States Patent
Lin et al.

(10) Patent No.: US 6,696,344 B1
(45) Date of Patent: Feb. 24, 2004

(54) METHOD FOR FORMING A BOTTLE-SHAPED TRENCH

(75) Inventors: Shian-Jyh Lin, Chiayi Hsien (TW); Hsin-Jung Ho, Taipei (TW); Chao-Sung Lai, Taoyuan (TW); Tzu-Ching Tsai, Taichung Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/384,947

(22) Filed: Mar. 10, 2003

(51) Int. Cl.[7] ............... H01L 21/8242; H01L 21/311
(52) U.S. Cl. ............... 438/386; 438/243; 438/700; 438/702; 438/753
(58) Field of Search ............... 438/243, 245, 438/246, 247, 248, 249, 386, 388, 389, 390, 391, 392, 700, 701, 702, 753

(56) References Cited

U.S. PATENT DOCUMENTS

| | | | | |
|---|---|---|---|---|
| 4,853,348 A | * | 8/1989 | Tsubouchi et al. | 438/246 |
| 5,629,226 A | * | 5/1997 | Ohtsuki | 438/389 |
| 5,877,061 A | * | 3/1999 | Halle et al. | 438/386 |
| 5,937,296 A | * | 8/1999 | Arnold | 438/270 |
| 6,271,079 B1 | * | 8/2001 | Wei et al. | 438/243 |
| 6,359,300 B1 | * | 3/2002 | Economikos et al. | 257/301 |
| 6,426,254 B2 | * | 7/2002 | Kudelka et al. | 438/246 |
| 2002/0182819 A1 | * | 12/2002 | Schrems et al. | 438/386 |
| 2003/0045052 A1 | * | 3/2003 | Birner et al. | 438/243 |
| 2003/0143802 A1 | * | 7/2003 | Chen et al. | 438/243 |
| 2003/0153158 A1 | * | 8/2003 | Ho et al. | 438/386 |

* cited by examiner

*Primary Examiner*—Mary Wilczewski
*Assistant Examiner*—Toniae M. Thomas
(74) *Attorney, Agent, or Firm*—Nelson A. Quintero

(57) ABSTRACT

A method for forming a bottle-shaped trench. A semiconductor substrate having a pad stack layer thereon and a trench in a predetermined position is provided. A first dielectric layer is then formed on the lower sidewalls of the trench. Next, a second dielectric layer is formed to cover the upper sidewalls of the trench and the pad stack layer. Then, a protection layer is formed on the sidewalls portions of the second dielectric layer. The first dielectric layer is then removed to expose the lower portion of trench. Wet stripping is then carried out to increase the radius of the lower portion of the trench thereby forming a bottle-shaped trench.

15 Claims, 4 Drawing Sheets

METHOD FOR FORMING A BOTTLE-SHAPED TRENCH

BACKGROUND OF THE INVENTION

1. Field of the Invention

The present invention relates to a fabrication process of dynamic random access memory (DRAM), and in particular to a method for forming a bottle-shaped trench.

2. Description of the Related Art

Generally speaking, the capacitors widely used in dynamic random access memory (DRAM) are formed by two conductive layers (electrode plate) having an insulation layer in between. The ability to store electric charges of a capacitor depends on the thickness of the insulation layer, surface area of the electrode plate and the electrical characteristics of the insulation material. In the recent development for the design of process for reducing sizes of semiconductor elements to enhance integration density, the area of memory cells in a memory must continuously be reduced to support a larger number of memory cells, thereby increasing density. Meanwhile, the electrode plates of a capacitor in a memory cell must contain sufficient surface area to store sufficient electrical charge.

Nevertheless, with sizes of elements continuously reduced, trench storage node capacitance of DRAM is decreased as well. As a result, storage capacitance must be increased to maintain good operating performance for memory.

Currently, the method for increasing storage capacitance for DRAMs increases the width of the bottom of the trench, thereby increasing surface area to form a bottle-shaped capacitor. The above method is carried out by selective oxidation of the upper portion of a trench to form a collar oxide layer to protect the upper portion of the trench. Next, the lower portion of the trench is wet-etched to form a bottle-shaped trench having a greater radius than the upper portion of the trench.

In a conventional process, a trench is formed by isotropic dry etching on a semiconductor substrate having a pad stack layer comprised of an oxide layer and a nitride layer formed thereon. Next, a nitride layer, an oxide layer, polysilicon layer and another oxide layer are sequentially formed on the pad stack layer and the trench. Nevertheless, the multiple deposition steps further increase the complexity of the process. Therefore, the traditional method is not economical due to high production costs and longer process time. Hence, a simplified process with high production yield for forming bottle-shaped trenches is required.

SUMMARY OF THE INVENTION

In order to solve the conventional problems, the invention utilizes only two depositions of oxide layers, followed by forming a sidewall protection layer in the upper portion of the trench. A bottle-shaped trench is then formed by wet stripping to increase the radius of the lower portion of the trench.

Accordingly, an object of the invention is to provide a method for forming bottle-shaped trenches that is simplified and economical.

The method for forming bottle-shaped trenches provided in the invention, including providing a semiconductor substrate having a pad stack layer thereon and a trench in a predetermined position, forming a first dielectric layer conformally on the pad stack layer and the sidewalls of the trench, filling the lower portion of the trench with a sacrificial layer, removing the first dielectric layer from the pad stack layer and the upper sidewalls of the trench, removing the sacrificial layer and leaving the first dielectric layer located on the lower sidewalls of the trench, forming a second dielectric layer conformally on the pad stack layer and the upper sidewalls of the trench and filling the lower portion of the trench to fully close the opening of the first dielectric layer, forming a protection layer conformally on the second dielectric layer, recessing the protection layer so that only the protection layer located on the upper sidewalls of the trench remains to form a sidewall protection layer, removing the second dielectric layer located at the bottom of the trench to form an opening, using the sidewall protection layer as a mask to remove the first dielectric layer and the second dielectric layer located at the lower portion of the trench to expose the lower sidewalls of the trench, and removing the lower sidewalls of the trench to form a bottle-shaped trench by wet stripping.

The pad stack layer, composed of a nitride layer and an oxide layer, is used as a hard mask for subsequent etching. The first dielectric layer and the second dielectric layer are dielectric material, such as tetraethylorthosilane (TEOS), oxide by SACVD, or oxide by plasma enhanced CVD. Formation of the dielectric layers is preferably low pressure CVD. High density plasma (HDP) is also applicable for the second dielectric layer. Sacrificial layer is preferably photoresist material, and the protection layer is preferably dielectric such as nitride.

Furthermore, removal of dielectric layer is carried is out by conventional methods, such as wet etching using diluted HF (DHF) or buffered HF (BHF).

According to the method for forming bottle-shaped trenches provided by the invention, process is greatly simplified and production time and costs are reduced. Thus, the method is more economical than conventional methods.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Refer to FIGS. 1A~1G, which illustrate cross sections of the method for forming bottle-shaped trenches according to the invention.

Figure 1A:
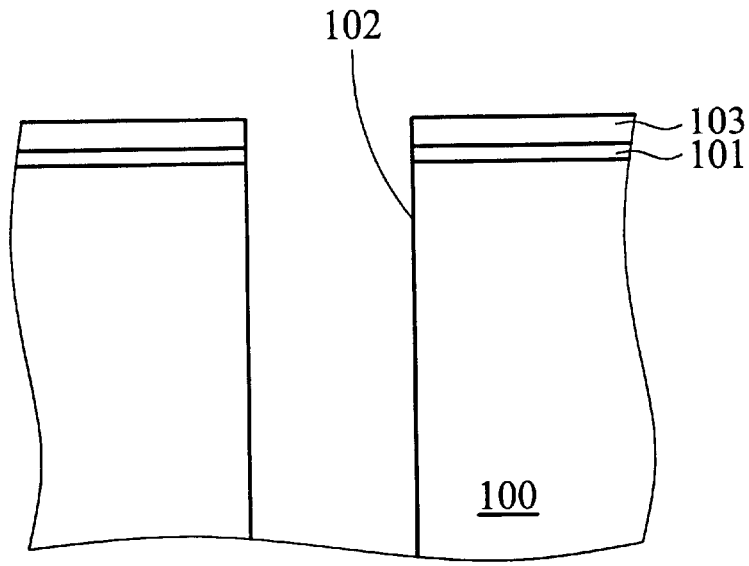
FIGS. 1A~1G are cross sections of the method for forming bottle-shaped trenches by the embodiment of the invention.

In FIG. 1A, which illustrates the initial step of the invention, 100 represents a semiconductor substrate, such as silicon. A pad stack layer is then formed on the substrate 100 by chemical vapor deposition (CVD). The pad stack layer is comprised of a nitride layer and an oxide layer. An oxide layer 101 is formed by CVD on the surface of the substrate 100, followed by the deposition of the nitride layer 103. Thickness of the oxide layer 101 is 200~3000 angstroms, and the nitride layer 103, 20~100 angstroms. The pad stack layer is used as a hard mask for the formation of a deep trench later.

Then, an opening is formed in the pad stack layer to expose partial surface of the substrate 100. The opening is formed by coating of a photoresist layer, followed by photolithography to form a photoresist pattern on the pad stack layer. Reactive ion etching (RIE) or plasma etching is then carried out to etch the pad stack layer, thus forming an opening. Next, plasma etching is carried out to expose the substrate, thereby forming a trench 102 in FIG. 1A. Formation of the trench is by anisotropic dry etching, such as RIE or plasma etching.

Figure 1B:
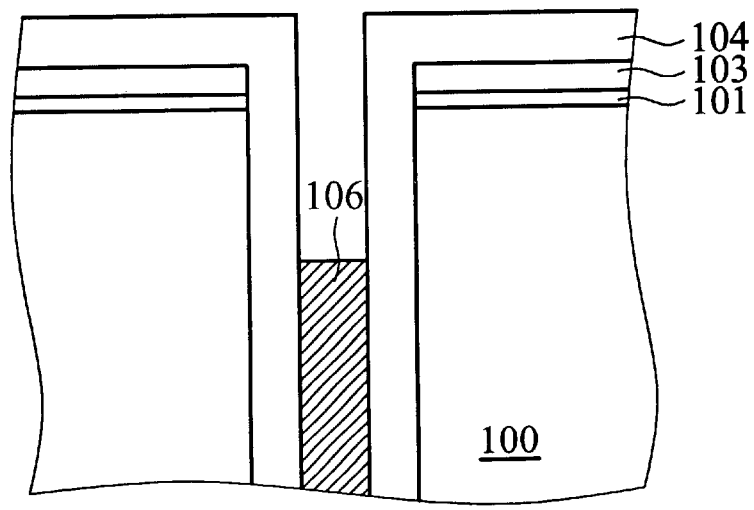

Next, as shown in FIG. 1B, a first dielectric layer 104 is conformally formed on the nitride layer 103 and sidewalls of the trench 102. Photoresist is then filled in the lower portion of the trench 102 to form a sacrificial layer 106. The first dielectric layer 104 is tetraethylorthosilane (TEOS). Other dielectric material, such as SACVD oxide or PECVD oxide is applicable as well. Formation of the first dielectric layer is preferably by LPCVD to a thickness of 50~600 angstroms.

Figure 1C:
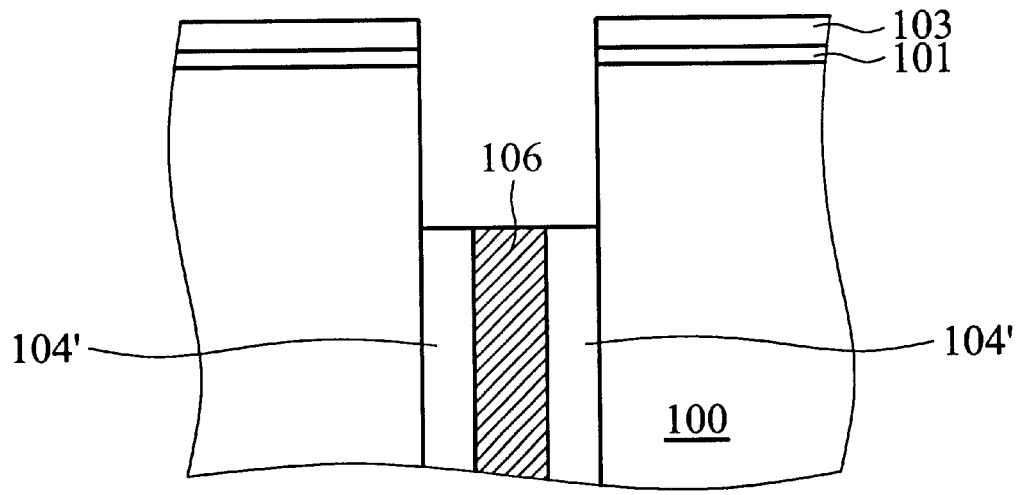

The sacrificial layer 106 is then used as an etching mask to remove the first dielectric layer 104 on the nitride layer 103 and upper sidewalls of the trench 102. The remaining first dielectric layer 104' is the same height as the sacrificial layer 106, as shown in FIG. 1C.

Figure 1D:
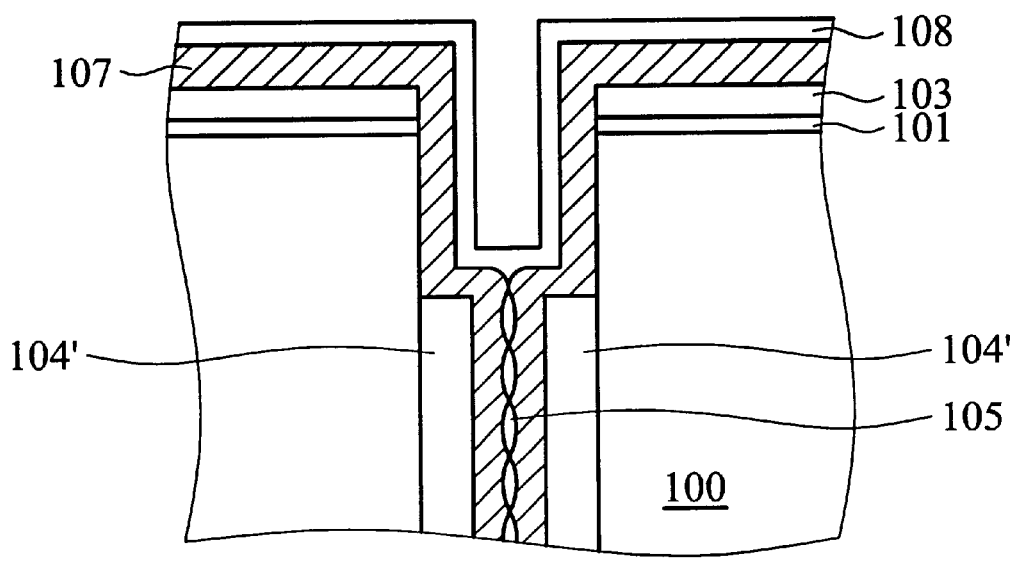

Next, in FIG. 1D, after removal of the sacrificial layer 106, CVD is again carried out to conformally form a second dielectric layer 107 on the pad stack layer and sidewalls of the trench, which fills the lower portion of the trench to fully close the opening of the first dielectric layer. The second dielectric layer is preferably PECVD TEOS or LPCVD TEOS. The opening in the remaining first dielectric layer 104' is closed, followed by formation of a protection layer 108 on the second dielectric layer 107. At this time, due to the narrow width of the trench, seam 105 is usually formed in the lower portion of the second dielectric layer 107, but is removed at a later stage, such that performance of the element is unaffected. The protection layer is preferably nitride, or other material such as polysilicon. Deposition of the protection layer is preferably by low pressure CVD.

Figure 1E:
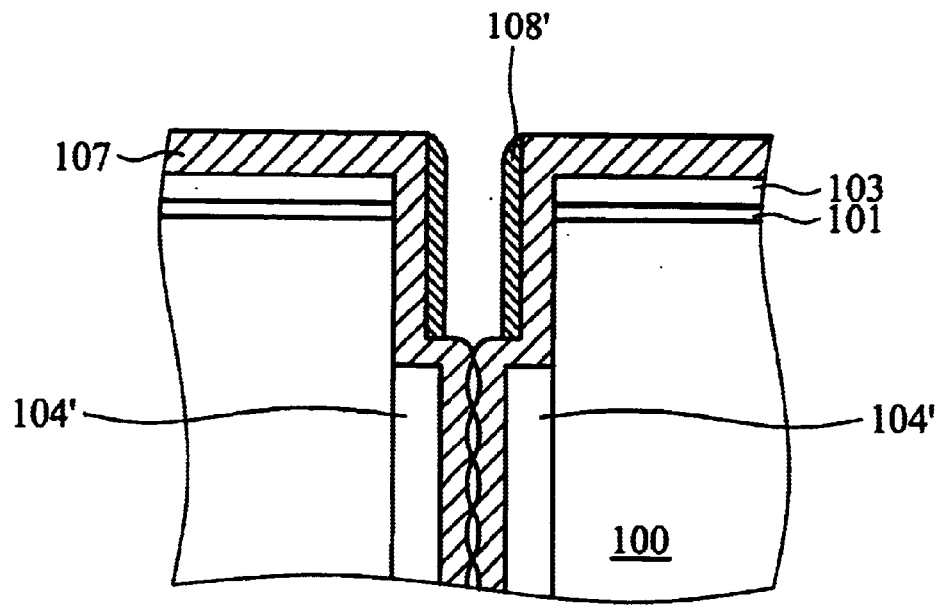
Figure 1E:
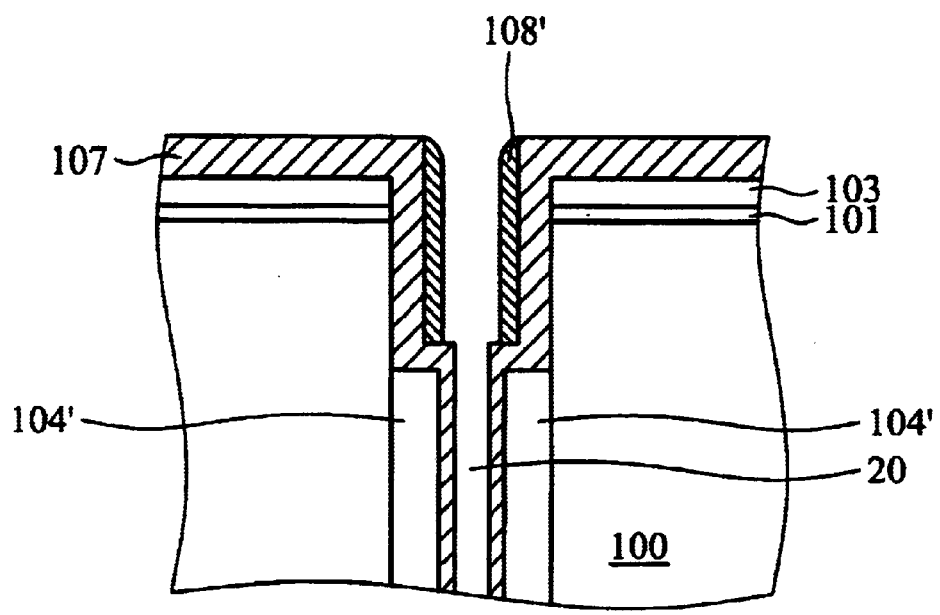
Figure 1F:
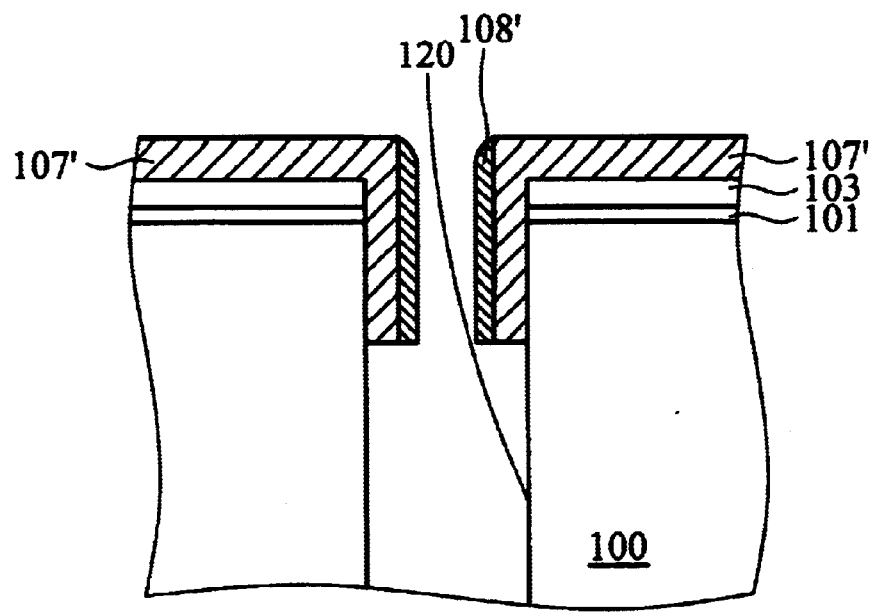

Then, as shown in FIG. 1E, protection layer 108 on the second dielectric layer and the bottom of the trench is removed to expose the second dielectric layer at the bottom of the trench, thereby forming a sidewall protection layer 108' on the sidewalls of the trench. This is preferably carried out by dry etching. Next, conventional methods for removing oxide are then carried out, such as using DHF or BHF to form an opening in the second dielectric layer at the bottom of the trench. The first dielectric layer and the second dielectric layer at the lower portion of the trench are removed to expose the lower sidewalls 120 as shown in FIG. 1F.

Figure 1G:
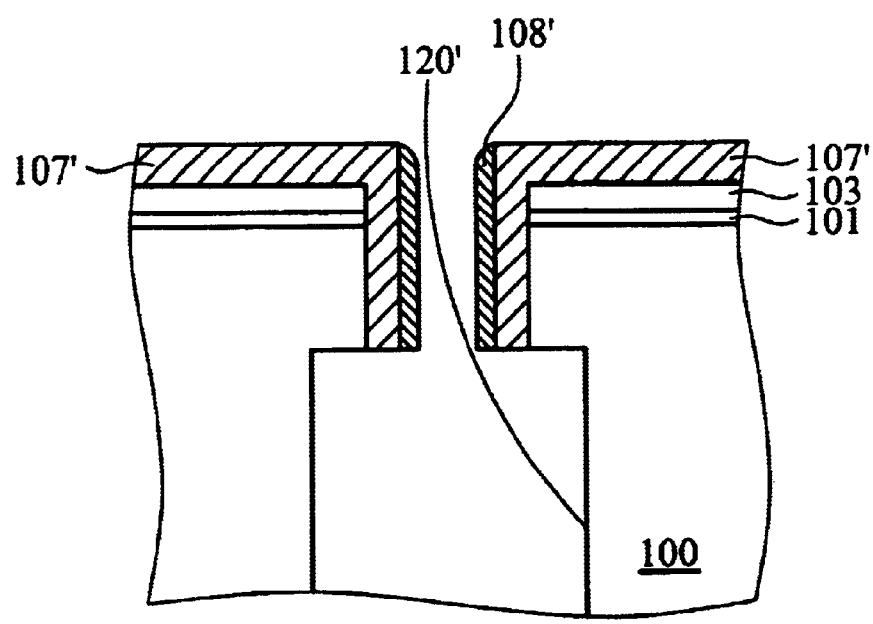

The radius of the lower portion of the trench is then increased by wet etching the lower sidewalls 120 of the trench, thereby forming a bottle-shaped trench 120' in FIG. 1G.

According to the method provided in the invention, process is simplified in comparison to conventional methods. Consequently, a more economical process for forming bottle-shaped trenches that saves production costs and time is then obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a bottle-shaped trench, comprising:

providing a semiconductor substrate having a pad stack layer thereon and a trench in a predetermined position;

forming a first dielectric layer conformally on the pad stack layer and the sidewalls of the trench;

filling the lower portion of the trench with a sacrificial layer;

removing the first dielectric layer on the pad stack layer and the upper sidewalls of the trench;

removing the sacrificial layer and leaving the first dielectric layer located on the lower sidewalls of the trench;

forming a second dielectric layer conformally on the pad stack layer, the upper sidewalls of the trench and filling the lower portion of the trench to fully close the opening of the first dielectric layer;

forming a protection layer conformally on the second dielectric layer;

recessing the protection layer so that only the protection layer located on the upper sidewalls of the trench remains to form a sidewall protection layer;

removing the second dielectric layer located at the bottom of the trench to form an opening;

using the sidewall protection layer as a mask to remove the first dielectric layer and the second dielectric layer located at the lower portion of the trench to expose the lower sidewalls of the trench; and removing the lower sidewalls of the trench to form a bottle-shaped trench by wet stripping.

2. The method as claimed in claim 1, wherein the pad stack layer comprises an oxide layer and a nitride layer.

3. The method as claimed in claim 1, wherein the first dielectric layer and the second dielectric layer are tetraethylorthosilane (TEOS).

4. The method as claimed in claim 1, wherein the sacrificial layer is photoresist.

5. The method as claimed in claim 1, wherein the protection layer is nitride.

6. The method as claimed in claim 1, wherein the first dielectric layer is removed by wet etching.

7. The method as claimed in claim 1, wherein the formation of the second dielectric layer is by plasma enhanced CVD or high density plasma (HDP).

8. The method as claimed in claim 1, wherein the protection layer is formed by low pressure CVD.

9. The method as claimed in claim 1, wherein the protection layer is recessed by dry etching.

10. The method as claimed in claim 1, wherein the opening in the second dielectric layer is formed by dry etching.

11. The method as claimed in claim 1, wherein the first and second dielectric layers are removed by wet etching.

12. The method as claimed in claim 1, wherein the bottle-shaped trench in the last step is formed by wet etching.

13. A method for forming a bottle-shaped trench; comprising the steps of:

providing a semiconductor substrate formed with a pad stack layer thereon and a trench in a predetermined position;

forming a first dielectric layer conformally on the pad stack layer and the sidewalls of the trench;

filling the lower portion of the trench with a photoresist layer;

removing the first dielectric layer from the pad stack layer and the upper sidewalls of the trench;

removing the photoresist layer and leaving the first dielectric layer located on the lower sidewalls of the trench;

forming a second dielectric layer conformally on the pad stack layer, the upper sidewalls of the trench and filling the lower portion of the trench to fully close the opening of the first dielectric layer;

forming a nitride layer conformally on the second dielectric layer;

recessing the nitride layer so that only the nitride layer located on the upper sidewalls of the trench remained to form a sidewall protection layer;

removing the second dielectric layer located at the bottom of the trench to form an opening;

using the sidewall protection layer as a mask to remove the first dielectric layer and the second dielectric layer located at the lower portion of the trench to expose the lower sidewalls of the trench; and removing the lower sidewalls of the trench to form a bottle-shaped trench by wet stripping.

14. The method as claimed in claim 13, wherein the pad stack layer comprises an oxide layer and a nitride layer.

15. The method as claimed in claim 13, wherein the first dielectric layer and the second dielectric layer are tetraethylorthosilane (TEOS).

* * * * *